United States Patent
Sakurai et al.

(10) Patent No.: US 6,706,391 B2
(45) Date of Patent: Mar. 16, 2004

(54) ANISOTROPICALLY ELECTROCONDUCTIVE FILM

(75) Inventors: Ryo Sakurai, Tokyo (JP); Hidetoshi Hiraoka, Tokyo (JP); Tokuo Okada, Tokyo (JP); Teruo Miura, Tokyo (JP); Yasuhiro Morimura, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 90 days.

(21) Appl. No.: 09/915,137

(22) Filed: Jul. 26, 2001

(65) Prior Publication Data

US 2002/0010247 A1 Jan. 24, 2002

Related U.S. Application Data

(63) Continuation of application No. PCT/JP00/08474, filed on Nov. 30, 2000.

(30) Foreign Application Priority Data

| Dec. 3, 1999 | (JP) | ......................................... | H11-345065 |
| Dec. 3, 1999 | (JP) | ......................................... | H11-345066 |
| Dec. 14, 1999 | (JP) | ......................................... | H11-354715 |

(51) Int. Cl.$^7$ .......................... B32B 27/18; B32B 27/20; B32B 27/26; B32B 27/30
(52) U.S. Cl. ................................ 428/355; 428/355 EP; 428/355 AC; 525/56; 525/58; 525/242; 525/256; 525/262; 525/263; 525/264; 525/266; 525/284; 525/286; 525/298; 525/301; 525/312
(58) Field of Search ................................ 524/439, 440, 524/441, 261, 265; 428/328, 355 EP, 355 EN, 355 AC; 525/56, 58, 242, 256, 262, 263, 264, 266, 298, 301, 312, 284, 286

(56) References Cited

U.S. PATENT DOCUMENTS

| 5,120,665 A | * | 6/1992 | Tsukagoshi et al. ........... 437/8 |
| 5,674,611 A | * | 10/1997 | Saida et al. ................. 428/344 |

FOREIGN PATENT DOCUMENTS

| JP | 49-97049 | | 9/1974 |
| JP | 51-105344 | * | 9/1976 |
| JP | 56-24425 | | 3/1981 |
| JP | 63-170482 | | 7/1988 |
| JP | 5-65466 | | 3/1993 |
| JP | 6-338860 | | 11/1994 |
| JP | 7-120914 | | 5/1995 |
| JP | 8-188748 | | 7/1996 |
| JP | 9-111216 | | 4/1997 |
| JP | 09-123891 | * | 5/1997 |
| JP | 09-124892 | * | 5/1997 |
| JP | 09-124893 | * | 5/1997 |
| JP | 9-227836 | | 9/1997 |
| JP | 10-007880 | * | 1/1998 |
| JP | 10-176142 | | 6/1998 |
| JP | 10-313158 | | 12/1998 |
| JP | 11-172217 | | 6/1999 |

* cited by examiner

Primary Examiner—Vivian Chen
(74) Attorney, Agent, or Firm—Kanesaka & Takeuchi

(57) ABSTRACT

An anisotropically electroconductive film, which has a high reliability in its capacity for conducting electricity and also a good adhesion under such an adhesive condition that the film is heated at a temperature of 130° C. or less for a short period of time, has a layer of an adhesive within which electroconductive particles are distributed. The adhesive is composed of a thermosetting resin composition including a base resin, a reactive compound, an organic peroxide and a reaction accelerating compound, and also the electroconductive particles incorporated into the thermosetting resin composition. The base resin is a polyacetalized resin which is obtained by acetalizing a polyvinyl alcohol. The reactive compound is at least one selected from a group consisting of acryloxy group-bearing compounds, methacryloxy group-bearing compounds and epoxy group-bearing compounds. The reaction accelerating compound is a compound which has a radically reactive group and alkali-reactive group as its end groups.

9 Claims, No Drawings

ANISOTROPICALLY ELECTROCONDUCTIVE FILM

CROSS REFERENCE TO RELATED APPLICATION

This is a continuation application of PCT/JP00/08474 filed on Nov. 30, 2000.

FIELD OF THE INVENTION

The present invention relates to an anisotropically electroconductive film which gives electroconductivity only along its thickness direction, and particularly relates to an anisotropically electroconductive film which is installed between circuits to bond to each other by being heated and pressurized. The anisotropically electroconductive film also conducts the circuits due to electroconductive particles contained therein.

BACKGROUND OF THE INVENTION

An anisotropically electroconductive film consists of an adhesive in which electroconductive particles are dispersed, and it gives an electroconductivity along its thickness direction by being pressurized towards the thickness. The anisotropically electroconductive film is installed between circuits standing opposite to each other and is heated and pressurized so that the circuits are bonded and conducted electrically. The anisotropically electroconductive film gives electroconductivity only in the direction of its thickness.

The anisotropically electroconductive film may be used for connecting a flexible printed circuit board (FPC) or TAB with an ITO terminal on a glass base plate of a liquid crystal panel. The anisotropically electroconductive film forms an anisotropically electroconductive layer between various terminals so as to stick the terminals physically together and to connect the terminals electrically.

Conventional anisotropically electroconductive films are generally composed of an adhesive which consists mainly of an epoxy resin or a phenolic resin and a hardening agent, and electroconductive particles which are dispersed in the adhesive, where a one-pack type thermoset adhesive is dominantly used. Although attempts have made to improve the adhesive strength of the anisotropically electroconductive film in order to achieve a stable reliability in connection between circuits at high temperature and high humidity contents, the conventional anisotropically electroconductive films composed of an epoxy resin or phenolic resin do not have sufficiently high adhesive strength, workability or resistance to humidity and heat.

Japanese Patent Publication H10-338860A has disclosed an anisotropically electroconductive film composed of a thermoset or photosetting adhesive which consists mainly of a polyacetalized resin obtained by acetalizing polyvinyl alcohol. The anisotropically electroconductive film has a high adhesive strength, a good workability and also a high resistance to humidity and heat.

Recently a liquid crystal film of which base material is a plastic film such as polyethylene terephthalate (PET) has been used and the anisotropically electroconductive film also has been used for bonding such liquid crystal films.

When the anisotropically electroconductive film is used for bonding a liquid crystal film, it is necessary to bond the anisotropically electroconductive film to the liquid crystal film in such a manner that the highest temperature during the bonding operation does not exceed a heat-resisting temperature of the liquid crystal film. However, the heat-resisting temperature of the liquid crystal film is usually lower than the temperature as high as 150 to 200° C. at which the anisotropically electroconductive film is commonly heated during the bonding operation. Thus, the liquid crystal film may be broken if the anisotropically electroconductive film is stuck to the liquid crystal film at a temperature between 150 and 200° C.

If the anisotropically electroconductive film is stuck to the liquid crystal film at a lower temperature than the heat-resisting temperature of the liquid crystal film, the anisotropically electroconductive film is not supplied with enough quantity of heat to stick, set, or flow whereby its adhesive properties and conductive characteristics are insufficient.

Therefore, an anisotropically electroconductive film should stick firmly to polymer films having low heat-resisting temperature to give enough electroconductivity even when they are stuck at a low temperature and for a short period of time. The anisotropically electroconductive film should also stick a printed circuit board or IC chip at a low temperature and for a short period of time in order to make thermal expansion and shrinkage of the printed circuit board and IC chip small.

Japanese Patent Publication H10-338844A has disclosed an anisotropically electroconductive film composed of a thermoset or photosetting adhesive which is composed mainly of a (meth-)acrylic resin obtained by polymerizing acrylic monomers and/or methacrylic monomers.

When an anisotropically electroconductive film is used for connecting FPC with an ITO terminal formed on a base plate of a liquid crystal panel, the anisotropically electroconductive film is required to stick firmly to both ITO and silica (SiOX) for the following reasons. That is, the ITO terminal is formed on a glass base plate of the liquid crystal panel by a vapor deposition process, spattering process, ion-plating process, CVD process and the like, and the base plate of the liquid crystal panel has been recently made of polyimide or polyethylene terephthalate (PET) for the purpose of reducing the weight or thickness of the base plate.

In this case, in order to form an ITO film having a good adherence on a resin base made of polyimide, PET or the like, the whole surface of the base plate is covered with a $SiO_X$ (including $SiO_2$) layer before the ITO is applied thereon, and thus the ITO layer is to be formed on the $SiO_X$ layer. The ITO layer on the $SiO_X$ layer is etched in order to form the ITO terminal on the $SiO_X$ layer. Therefore, the anisotropically electroconductive film to be used for sticking the base plate is required to have a high adhesive strength to both ITO and $SiO_X$ since the ITO terminal is formed on the $SiO_X$ layer.

However, the conventional anisotropically electroconductive film does not have a high adhesion strength to either ITO or $SiO_X$, and it has been desired to be improved in their adhesion properties.

Recently, there has arisen a problem of expansion of a base plate caused due to heat or pressure applied to the anisotropically electroconductive film, since a pitch of electrodes on the base plate has been finer for the purpose of implementing circuits at a high density. There also has arisen a problem of damage to the base plate from the heat and pressure applied to the anisotropically electroconductive film, since the base plate has consisted of material having low resistance to heat and pressure for the purpose of reducing the weight and production cost thereof. Thus, anisotropically electroconductive films made from radical-reaction type materials have been developed in order to be bonded to the base plate at a lower temperature and lower pressure at which the conventional epoxy or phenolic anisotropically electroconductive film is not bonded to the base plate.

However, when the reaction rate of the adhesive is excessively increased for the purpose of lowering the temperature and pressure applied to the radical-reaction type adhesive, the adhesive loses flowability and hardens before the electroconductive particles therein contacts the electrodes so as not to provide enough electroconductivity. Furthermore, the radical-reaction type adhesive is unduly lowered in its adhesion strength when the adhesive hardens before it sufficiently wets the surface of the base plate.

SUMMARY OF THE INVENTION

It is a first object of the present invention to provide an anisotropically electroconductive film having high adhesion strength with high conductivity even when the anisotropically electroconductive film is heated at a temperature of not higher than 130° C. and for a short period of time for sticking.

In order to achieve the first object, an anisotropically electroconductive film of a first aspect consists of an adhesive in which electroconductive particles are dispersed. The adhesive is composed of a thermosetting resin composition including a base resin, at least a reactive compound, at least an organic peroxide, at least a reaction accelerating compound, and the electroconductive particles. The base resin is a polyacetalized resin which is obtained by acetalizing a polyvinyl alcohol. The reactive compound is at least one selected from the group consisting of acryloxy group-bearing compounds, methacryloxy group-bearing compounds and epoxy group-bearing compounds, and the reaction accelerating compound is a compound which has at least a radically reactive group and alkali-reactive group as its end groups.

The polyacetalized resin is prompted in its adhesive reaction at a low temperature and has a strong adhesive strength by containing the reaction accelerating compound which has the radically reactive group and the alkali-reactive group as its end groups.

In the first aspect, the thermosetting resin composition is preferable to include at least one reaction accelerating compound in an amount of 0.5 to 50 parts by weight per 100 parts by weight of the base resin. The reaction accelerating compound is preferable to have an acryloxy group or methacryloxy group as the radically reactive group and to have a carboxyl group or acidic hydroxyl group as the alkali-reactive group, which is preferable to be at least one selected from the group consisting of acrylic acid, 2-acryloyloxyethylsuccinic acid, 2-acryloyloxyethylphthalic acid, 2-acryloyloxyethylhexahydrophthalic acid, methacryl acid, 2-methacryloyloxyethylsuccinic acid and 2-methacryloyloxyethylhexahydrophthalic acid.

Further, the thermosetting resin composition is preferable to include the reactive compound in an amount of 0.5 to 80 parts by weight per 100 parts by weight of the base resin.

The organic peroxide is preferable to be a low-temperature-decomposable organic peroxide which has a 10 hours half-life temperature of not greater than 80° C. The thermosetting resin composition is preferable to include the organic peroxide in an amount of 0.1 to 10 parts by weight per 100 parts by weight of the base resin.

The content of acetal groups of the polyacetalized resin adopted as base resin is equal to or more than 30 mole percent.

The thermosetting resin composition of the first aspect is preferable to include a silane coupling agent in an amount of 0.01 to 5 parts by weight per 100 parts by weight of the base resin.

The anisotropically electroconductive film of the first aspect is disposed or installed between circuits which stand opposite to each other, and it electrically connects the circuits and also physically sticks the ones together after being heated and pressed. The anisotropically electroconductive film of the first aspect is preferable to be heated during a bonding process at a temperature not greater than 130° C.

The anisotropically electroconductive film of the first aspect has such advantages as follows.
1) The anisotropically electroconductive film sticks to objects to be stuck together at a low temperature whereby the film sticks the objects having low resistance to a high temperature, with excellent electroconductive properties without causing breakage of the objects.
2) The anisotropically electroconductive film has good resistance to humidity and heat, so that the film has good anisotropic electroconductive properties after it held at a high temperature and humidity for a long period of time.
3) The anisotropically electroconductive film has good repairability.
4) The anisotropically electroconductive film has high transparency.
5) The anisotropically electroconductive film exhibits more stable and higher adhesion than conventional ones.
6) The anisotropically electroconductive film has a good light-transmittance since the film is composed of a film made from transparent polymers, so that the film can provide a good workability in positioning electrodes.
7) Although the conventional anisotropically electroconductive films of epoxy type or the like need to be heated to 150° C. or higher, the anisotropically electroconductive film of the present invention sticks at a temperature of not higher than 130° C., particularly not higher than 100° C. When the film is made to be provided with ultraviolet-curing (UV-curing) characteristics, the anisotropically electroconductive film sticks to objects at a still lower temperature.
8) The conventional anisotropically electroconductive films of epoxy type and phenolic type are hard to stick to the electrode temporarily and are easy to separate therefrom, since the conventional films is poor in sticking. In contrast the anisotropically electroconductive film of the present invention has enough high adhesion strength to adhere on the electrode temporarily.

It is a second object of the present invention to provide an anisotropically electroconductive film which has good adhesion to both ITO and $SiO_X$.

In order to achieve the second object, an anisotropically electroconductive film of the second aspect consists of an adhesive containing electroconductive particles dispersed therein. The adhesive is composed of a thermosetting resin composition or photo-setting resin composition including base resin, melamine resin, and the electroconductive particles.

The adhesion of the anisotropically electroconductive film to both ITO and $SiO_X$ is exceedingly improved by incorporating the melamine resin into the resin composition.

In the second aspect, the base resin is preferably polyacetalized resin obtained by acetalizing polyvinyl alcohol or a (meth-)acrylic resin obtained by polymerizing acrylic monomers and/or methacrylic monomers.

The resin composition of the anisotropically electroconductive film is preferable to include the melamine resin in an amount of 1 to 200 parts by weight per 100 parts by weight of the base resin. When the resin composition further includes an urea resin in an amount of 0.01 to 10 parts by weight per 100 parts by weight of the base resin, the adhesive catches bubbles scarecely whereby the anisotropically electroconductive film is further improved in its electroconductivity and adhesion.

The anisotropically electroconductive film of the second aspect is preferable to include at least an organic peroxide or photosensitizer in an amount of 0.1 to 10 parts by weight, at least one reactive compound selected from the group consisting of acryloxy group-bearing compounds, methacryloxy group-bearing compounds and epoxy group-bearing compounds in an amount of 0.5 to 80 parts by weight, a silane coupling agent in an amount of 0.01 to 5 parts by weight, and a hydrocarbon resin in amount of 1 to 200 parts by weight, per 100 parts by weight of the base resin.

The content of the electroconductive particles is preferable to be 0.1 to 15 percent by volume for the base resin.

The anisotropically electroconductive film of the second aspect has the advantages 2) through 8) among the aforementioned advantages 1)through 8) of the anisotropically electroconductive film of the first aspect.

The anisotropically electroconductive film has good resistance to humidity and heat, so that the film has good anisotropically electroconductive properties after it is held at a high temperature and humidity for a long period of time.

It is a third object of the present invention to provide an anisotropically electroconductive film which is easy to control the rate of its hardening reaction and has high reliability in conducting electricity and good adhesive properties even if the film is heated at a low temperature under low pressures during a bonding process.

An anisotropically electroconductive film of the third aspect consists of an adhesive containing electroconductive particles dispersed therein. The adhesive is composed of thermosetting or photo-setting resin composition including a base resin, at least a polymerization inhibitor, and the electroconductive particles.

The anisotropically electroconductive film of the third aspect can be adjusted time for starting to cure by adjusting the content of the polymerization inhibitor, whereby the film achieves good adhesion and high reliability in its conductivity.

In the third aspect, the base resin is preferable to be polyacetalized resin obtained by acetalizing polyvinyl alcohol or (meth-)acrylic resin obtained by polymerizing acrylic monomers and/or methacrylic monomers.

The resin composition of the anisotropically electroconductive film of the third aspect is preferable to include the polymerization inhibitor in an amount of 100 to 50000 ppm.

The anisotropically electroconductive film of the third aspect is preferable to include at least an organic peroxide or photosensitizer in an amount of 0.1 to 10 parts by weight, at least one reactive compound selected from the group consisting of acryloxy group-bearing compounds, methacryloxy group-bearing compounds and epoxy group-bearing compounds in an amount of 0.5 to 80 parts by weight, a silane coupling agent in an amount of 0.01 to 5 parts by weight, and a hydrocarbon resin in an amount of 1 to 200 parts by weight, per 100 parts by weight of the base resin.

The content of the electroconductive particles is preferable to be 0.1 to 15 percent by volume for the base resin, and the mean diameter of the electroconductive particles is preferable to be 0.1 to 100 $\mu$m.

The anisotropically electroconductive film of the third aspect has the advantages 2) through 8) among the aforementioned advantages 1) through 8) of the anisotropically electroconductive film of the first aspect.

DETAILED DESCRIPTION OF THE PREFERRED EMBODIMENTS

Hereinafter, embodiments of the present invention will be described in detail. It should be noted that the following description I will mainly provide explanations of the first aspect, yet it will partly provide explanations of the second and third aspects.

I. The Anisotropically Electroconductive Film of the First Aspect

In the first aspect, the base resin of the thermosetting resin composition of which the adhesive is composed is a polyacetalized resin obtained by acetalizing a polyvinyl alcohol, and the polyacetalized resin is preferable to have acetal groups at a rate of 30 mole percent or more. When the content of the acetal groups is less than 30 mole percent, the anisotropically electroconductive film may be lowered in resistance to humidity. Examples of the polyacetalized resin are polyvinyl formal resin, polyvinyl butyral resin and the like, especially polyvinyl butyral resin. The commercially available polyvinyl butyral resin may be used, such as "Denka PVB 3000-1" and "Denka PVB 2000-L" produced by Denki Kagaku Kogyo Co. Ltd.

In the first aspect, at least a reactive compound (such as monomer) having an acryloxy group, methacryloxy group or epoxy group is used so as to improve and adjust the characteristics (mechanical strength, adhesive properties, optical properties, resistance to heat, resistance to humidity, resistance to weather, rate of crosslinking and other) of the anisotropically electroconductive film. The reactive compound may be derivatives of acrylic acids or methacrylic acids, for example, the ester and the amide thereof. Examples of a hydrocarbon group of ester are alkyl groups such as methyl, ethyl, dodecyl, stearyl and lauryl, cycrohexyl group, tetrahydrofurfuryl group, aminoethyl group, 2-hydroxyethyl group, 3-hydroxypropyl group, 3-chloro-2-hydroxypropyl group and the like. The ester of multifunctional alcohol may be used just as the aboves, such as: ethylene glycol, triethylen glycol, polypropylene glycol, polyethylene glycol, trimethylolpropane and pentaerythritol. As the amide, diacetone acrylamide is typically used. As the multifunctional crosslinking agent, the acrylic or methacrylic ester of trimethylolpropane, pentaerythritol and glycerine may be used. Examples of the epoxy group-bearing compound are triglycidyl tris(2-hydroxy ethyl)isocyanurate, neopentyl glycol diglycidyl ether, 1,6-hexanediol diglycidyl ether, allyl glycidyl ether, 2-ethylhexyl grycidyl ether, phenyl glycidyl ether, phenol $(EO)_5$ glycidyl ether, p-t-butylphenyl grycidyl ether, diglycidyl ester adipate, diglycidyl ester phthalate, glycidyl methacrylate and butyl grycidyl ether. Further, alloyed polymers bearing epoxy groups can be used just as the above.

One alone or a mixture including more than two of these reactive compounds is added preferably in an amount of 0.5 to 80 parts by weight, more preferably 0.5 to 70 parts by weight per 100 parts by weight of the base resin. The reactive compound more than 80 parts by weight will result in poor workability in preparing the adhesive or result in poor formability in forming the layer of the adhesive.

In the first aspect, an organic peroxide may be contained in the thermosetting resin composition for setting. A low-temperature-decomposable organic peroxide which has a 10 hours half-life temperature of not greater than 80° C., particularly not greater than 70° C., is preferable for use. Although the lower limit of the 10 hours half-life temperature of the low-temperature-decomposable organic peroxide is not limitative, it may be about 50° C. Examples of such organic peroxides are benzoyl peroxide, stearoyl peroxide and the like.

The content of the above organic peroxide is preferable to be 0.1 to 10 parts by weight per 100 parts by weight of the base resin.

In the first aspect, at least a compound having a radically reactive group and an alkali-reactive group as its end groups may be used as a reaction accelerating compound so as to prompt the adhesive reaction of the base resin at a low temperature. The reaction accelerating compound has preferably an acryloxy group or a methacryloxy group as a radically reactive group, and a carboxyl group or an acid hydroxyl group as an alkali-reactive group, and is preferable to be one or more than two selected from the group including acrylic acid, 2-acryloyloxy ethylsuccinic acid, 2-acryloyloxy ethylphthalic acid, 2-acryloyloxy ethylhexahydrophthalic acid, methacrylic acid, 2-methacryloyloxy ethylsuccinic acid and 2-methacryloyloxy ethylhexahydrophthalic acid.

The content of the reaction accelerating compound is preferable to be 0.5 to 50 parts by weight per 100 parts by weight of the base resin, since too small amount of the reaction accelerating compound does not give an adequate effect of improving the adhesive reactivity at a low temperature, while too large amount of the reaction accelerating compound decreases the three dimensional crosslink density whereby the anisotropically electroconductive film results in low reliability in conducting electricity.

The anisotropically electroconductive films of the first, second and third aspects are preferable to be added with a silane coupling agent(s) as adhesion accelerator. As the silane coupling agent, it is preferable to use one alone or a mixture composed of two or more selected from the group consisting of vinyl triethoxysilane, vinyl tris(β-methoxyethoxy)silane, γ-methacryloxypropyl trimethoxysilane, vinyl triacetoxysilane, γ-glycidoxypropyl trimethoxysilane, γ-glycidoxypropyl triethoxysilane, β-(3,4-epoxycyclohexyl)ethyltrimethoxysilane, vinyl trichlorosilane, γ-mercaptopropyl trimethoxysilane, γ-aminopropyl triethoxysilane, and N-β-(aminoethyl)-γ-aminopropyl trimethoxysilane.

0.01 to 5 parts by weight of the silane coupling agent per 100 parts by weight of the base resin may be sufficient for the anisotropically electroconductive film to be added with.

The thermosetting resin composition of the first aspect and those of the second and third aspects described later may be added with a hydrocarbon resin so as to improve processing characteristics and laminating characteristics. The hydrocarbon resin can be either the natural resin or synthetic resin. The natural hydrocarbon resin may be rosin, rosin derivatives or terpene resin. Examples of the rosin are gum resin, tall oil resin and wood resin. The rosin derivative may be hydrogenated rosin, disproportionated rosin, polymerized rosin, esterified rosin and metallized rosin may be used. Examples of the terpene resin are monoterpene resins such as a α-pinene, β-pinene and the like, and terpene phenol resins. The other examples of the natural resin are dammar, copal and shellac. The synthetic resin may be petroleum resins, phenol resins or xylene resins. Examples of the petroleum resin are aliphatic resins, aromatic resins, cycloaliphatic resins, copolymer resins, hydrogenated resins, pure monomer resins and coumarone-indene resins. Examples of the phenol resin are alkylphenol resins and denatured phenol resins. Examples of the xylene resin are so-called xylen resins and denatured xylen resins.

The content of the hydrocarbon resin is not limitative, but it is preferable to be 1 to 200 parts by weight, particularly 5 to 150 parts by weight per 100 parts by weight of the base resin.

Besides the above additives, the thermosetting resin composition of the first aspect and those of the second and third aspects described later may be added with an age resistor, ultraviolet absorber, dyes, processing aids or the like.

In the first, second and third aspects, a variety of electroconductive particles may be used. Examples of the electroconductive particles are metal or alloy powder of copper, silver, nickel, etc. and resin or ceramic particles covered with such metal or alloy. The shape of the electroconductive particles is not limitative. The electroconductive particles may have any shape of a flake-like shape, a branch-like shape, a grain-like shape, a pellet-like shape, etc.

The electroconductive particles are preferable to have a modulus of elasticity of $1.0 \times 10^7$ to $1.0 \times 10^{10}$ Pa. That is, when an anisotropically electroconductive film including electroconductive particles which have a high modulus of elasticity is used for bonding objects such as liquid crystal films of which the base material is plastic film, breakage such as cracking may occur to the bonded objects and spring back may be caused due to elastic recovery of the particles after bonding the objects whereby the anisotropically electroconductive film cannot be equipped with stable electrical conductive properties. Therefore, electroconductive particles having a modulus of elasticity within the above range are recommended. With using such electroconductive particles, it is possible to prevent the breakage of bonded objects and to depress the spring back caused due to elastic recovery of the particles; besides, it is also possible to increase contact area of the electroconductive particles, so that the stable conductive properties with good reliability can be achieved. Electroconductive particles having a modulus of elasticity of $1.0 \times 10^7$ Pa or less are easily damaged, thereby making the conductive properties worse, and electroconductive particles having a modulus of elasticity of $1.0 \times 10^{10}$ Pa or more can allow the spring back to occur. The electroconductive particles may consist of plastic core particles which have a modulus of elasticity within the above range and a surface layer of the above metal or alloy coated thereon.

In the first, second and third aspects, the content of electroconductive particles is preferable to be in the range from 0.1 to 15 volume percent for the base resin, and the diameter of the electroconductive particles is preferable to be 0.1 to 100 $\mu$m in order to give an excellent conductivity.

The anisotropically electroconductive films of the first, second and third aspects are composed of an adhesive in which the electroconductive particles are dispersed. The adhesive is preferable to have a melt flow rate (MFR) of 1 to 3000, more preferably 1 to 1000, most preferably 1 to 800. The adhesive is preferable to have fluidity of $10^5$ Pa·s or less at a temperature of 70° C.

The aforementioned base resin is mixed homogeneously with the aforementioned additives and electroconductive particles according to the predetermined recipe and is kneaded by an extruder, rolls etc. After that, the mixture is formed into the desired shape of a film by a production method such as calender roll method, T-die extrusion method, inflation method and the like whereby the anisotropically electroconductive films of the first aspect and the second and third aspects to be described later are produced. In the step of formation of the film, embossing may be applied to the film in order to prevent blocking and facilitate bonding of the film to objects to be bonded.

The resulted anisotropically electroconductive film may be laminated on the objects to be bonded (such as polyimide, copper foil, etc.) by conventional methods; such as, a laminating method using hot press, a direct laminating method using an extruding machine or calendering machine, a hot press laminating method using a film laminator and the like.

The anisotropically electroconductive film may be prepared, instead threabove, by dissolving the components of the film homogeneously into a solvent which has no effect to a member (such as a separator) and, then, being applied uniformly to the surface of the member. In this case, another object (such as polyimide, copper foil, etc.) to be bonded to the member is temporarily contacted to the member, and then the object and the member are bonded each other by thermosetting the film components.

Although the type of the object to be bonded by the anisotropically electroconductive film of the first aspect is not limited, the film serves especially to bond objects which have low resistance to heat since the film adheres firmly at a low temperature. Thus, the anisotropically electroconductive film of the first aspect is effective to bond a terminal of a liquid crystal film having a plastic base film and a terminal of an electronic part. Examples of the electronic part are a flexible printed circuit (FPC), TAB and the like. Examples of the plastic base film of the liquid crystal film are transparent polymer film materials including PET, polyester, polycarbonate, polyether sulfone and the like. Among these materials, PET is particularly useful in terms of economy. The anisotropically electroconductive film of the first aspect is also effective to bond a printed circuit board, an IC chip, or the like where the circuit is finely or closely integrated so as to be easily and adversely affected by its thermal expansion and shrinkage.

The anisotropically electroconductive film of the first aspect can be thermoset at a temperature of 130° C. or less, preferably in a range of 100° C. to 130° C., so that it can successfully adhere to such objects having low resistance to heat. 10 to 30 seconds are sufficient to thermoset the anisotropically electroconductive film. The anisotropically electroconductive film is applied with pressure through its thickness direction during its adhesion and electroconductivity arises in the film in the direction. The pressure is preferable to be 0.5 to 5 MPa, particularly 1.0 to 3.0 MPa, but it is not limitative thereto.

The anisotropically electroconductive film of the first aspect is preferable to have a conductivity of 10Ω or less, particularly 5Ω or less through its full thickness, and resistivity of $10^6$Ω or more, particularly $10^9$Ω or more in the direction along its surface.

Hereinafter, the first aspect will be described referring to examples and a comparative example.

EXAMPLES 1–3 AND COMPARATIVE EXAMPLE 1

25 weight percent toluene solution of polyvinyl butyral ("Denka PVB 3000-1" produced by Denki Kagaku Kogyo Co. Ltd.,) was prepared and the additives shown in Table 1 were added in the solution at amounts shown in Table 1. The solution thus prepared was applied on a separator made of polyethyleneterephthalate by a bar coater so as to make a film having a width of 1.5 mm and a thickness of 15 μm. The film on the separator was peeled therefrom to become the anisotropically electroconductive film.

The film was used for bonding a printed flexible circuit board to a liquid crystal film having the base film of PET. The anisotropically electroconductive film separated from the separator was disposed there between by a monitor. After that, the film was heated at 130° C. and pressurized at 3 MPa for 20 seconds. In order to study the adhesive properties of the resulted film, the adhesive strength was measured by a tensile strength tester in 90° peel strength test (50 mm/min) and the electrical resistance through the full thickness of the film and in the direction along the surface of the film were measured by a digital multimeter. The results of the measurement are shown in Table 1.

TABLE 1

|  | Example | | | Comparative Example |
|---|---|---|---|---|
|  | 1 | 2 | 3 | 1 |
| themosetting resin composition [parts by weight] | | | | |
| base resin | 100 | 100 | 100 | 100 |
| organic peroxide *1 | 4 | 4 | 4 | 4 |
| reactive compound 1 *2 | 20 | — | — | — |
| reactive compound 2 *3 | — | — | 20 | 20 |
| reactive compound 3 *4 | — | 20 | — | — |
| reaction accelerating compound 1 *5 | 4 | 4 | — | — |
| reaction accelerating compound 2 *6 | — | — | 4 | — |
| silane coupling agent *7 | 1 | 1 | 1 | 1 |
| hydrocarbon resin *8 | — | — | 3 | — |
| conductive particles *9 | 10 | 10 | 10 | 10 |
| anisotropic conductive film | | | | |
| adhesive strength (kg/inch) | 2.8 | 2.5 | 2.7 | 0.7 |
| conductive resistance (Ω) | less than 0.6 | less than 0.6 | less than 0.6 | less than 0.6 |
| insulation resistance (Ω) | more than $10^{13}$ | more than $10^{13}$ | more than $10^{13}$ | more than $10^{13}$ |

*1: benzoyl peroxide
*2: neopentyl glycol diacrylate
*3: pentaerythritol tetraacrylate
*4: neopentyl glycol dimethacrylate
*5: acrylic acid
*6: methacrylic acid
*7: γ-methacryloxypropyl trimethoxysilane
*8: "Arukon P70", a hydrocarbon resin produced by Arakawa Kagaku Inc.
*9: Nickel particles produced by Fukuda Kinzoku Haku Fun Kogyo Inc., which have an average diameter of 5 μm and are expressed by percentage by volume for base resin It is apparent from Table 1 that the anisotropically electroconductive film of the first aspect has excellent adhesive properties at a low temperature.

As described above, according to the first aspect, there can be provided an anisotropically electroconductive film which has a high reliability in electroconductivity electricity and good adhesive properties under such an adhesive condition that the film is heated at a temperature of 130° C. or less, and for a short period of time.

The film of the first aspect bonds a terminal of an object such as a liquid crystal having low heat-resistance to a terminal of FPC, TAB and the like. The film is also suitable to stick a printed circuit board, IC chip and the like, having circuits finely or closely integrated which is easily and adversely affected by its thermal expansion and shrinkage.

II. The Anisotropically Electroconductive Film of the Second Aspect

Hereinafter, preferred embodiments of the second aspect will be described in detail, yet the followings will partly provide explanations of the third aspect.

In the second and third aspects, the base resin of the resin composition of which the film is composed is polyacetalized resin obtained by acetalizing a polyvinyl alcohol, or (meth-) acrylic resin obtained by polymerizing acrylic monomers and/or methacrylic monomers. The preferred polyacetalized resin is the same referred in the first aspect.

In the second and third aspects, the monomers composing the (meth-)acrylic resin which is obtained by polymerizing one or more than two types of acrylic monomers and methacrylic monomers are selected from among acrylic esters or methacrylic esters. For example, ester of an acrylic acid or methacrylic acid and an aliphatic alcohol having the number of carbon of 1 to 20, particularly 1 to 18 and having at least a non-substituting group or a substituent such as an epoxy group may be employed.

Examples of the acrylinc monomer are methyl acrylate, ethyl acrylate, isoamyl acrylate, lauryl acrylate, stearyl acrylate, butoxyethyl acrylate, ethoxydiethylene glycol acrylate, methoxytriethylene glycol acrylate, methoxypolyethylene glycol acrylate, methoxydipropylene glycol acrylate, phenoxyethyl acrylate, phenoxypolyethylene glycol acrylate, tetrahydrofurfuryl acrylate, isobornyl acrylate, 1-hydroxyethyl acrylate, isooctyl acrylate, isomyristyl acrylate, isostearyl acrylate, 2-ethylhexyl diglycol acrylate, 2-hydroxybutyl acrylate, polytetramethylene glycol diacrylate, EO-modified trimethylolpropane acrylate, perphlorooctylethyl acrylate, trimethylolpropane triacrylate, EO-modified trimethylolpropane triacrylate, pentaerythritol triacrylate, pentaerythnrtol tetraacrylate, dipentaerythritol hexaacrylate, neopentyl glycol acrylic benzoate, triethylene glycol diacrylate, polyethylene glycol diacrylate, neopentyl glycol diacrylate, 1,6-hexanediol diacrylate, 1,9-nonanediol diacrylate, dimethyloltricyclodecane diacrylate, 2-hydroxyethyl acrylate, 2-hydroxypropyl acrylate, 2-hydroxy-3-phenoxypropyl acrylate.

Examples of methacrylic monomer are methyl methacrylate, ethyl methacrylate, n-butyl methacrylate, isobutyl methacrylate, 2-ethylhexyl methacrylate, isodecyl methacrylate, n-lauryl methacrylate, $C_{12}$, $C_{13}$-mixed alkyl methacrylate, tridecyl methacrylate, $C_{12}$–$C_{15}$-mixed alkyl methacrylate, n-stearyl methacrylate, methoxydiethylene glycol methacrylate, methoxypolyethylene glycol methacrylate, cyclohexyl methacrylate, tetrahydrofurfuryl methacrylate, benzyl methacrylate, phenoxyethyl methacrylate, isobornyl methacrylate, 2-hydroxyethyl methacrylate, 2-hydroxypropyl methacrylate, 2-hydroxybutyl methacrylate, dimethylaminoethyl methacrylate, diethyl aminoethyl methacrylate, glycerine dimethacrylate, ethylene glycol dimethacrylate, diethylene glycol dimethacrylate, 1,4-butanediol dimethacrylate, 1,6-hexanediol dimethacrylate, 1,9-nonanediol dimethacrylate, trimethylolpropane trimethacrylate, tert-butyl methacrylate, isostearyl methacrylate, methoxytriethylene glycol methacrylate, n-butoxyethyl methacrylate, 3-chloro-2-hydroxypropyl methacrylate, triethylene glycol dimethacrylate, polyethylene glycol dimethacrylate, neopentyl glycol dimethacrylate, triphloroethyl methacrylate, 2,2,3,3-tetraphloropropyl jmethacrylate, 2,2,3,4,4,4-hexaphlorobutyl methacrylate, perphlorooctylethyl methacrylate, 1,3-butanediol dimethacrylate, 1,10-decanediol dimethacrylate, dibromoneopentyl glycol dimethacrylate, glycidyl methacrylate.

The acrylic monomer and methacrylic monomer are preferably ester of an acrylic acid or methacrylic acid and a monovalent alcohol, particularly an aliphatic. The aliphatic monovalent alcohol is the one having an alcoholic hydroxyl group which is not bonded to an aromatic ring such as a phenyl group.

In the second aspect, a melamine resin is used in order to improve the adhesive properties of the anisotropically electroconductive film. The melamine resin may be one or more among melamine resin, butylated melamine resin including isobutylated melamine resin, n-butylated melamine resin and the like, a methylated melamine resin, etc. The content of the melamine resin is preferable to be 1 to 200 parts by weight, particularly 1 to 100 parts by weight per 100 parts by weight of the base resin. The melamine resin less than 1 parts by weight does not give an adequate effect of improving the adhesive properties, while the melamine resin more than 200 parts by weight makes the conductivity worse.

The resin composition of the second aspect is preferable to be added with urea series resin in order to prevent the layer of adhesive from catching bubbles, so that the anisotropically electroconductive film can achieve superior conductivity and adhesive properties. The urea series resin may be urea resin, butylated urea resin and the like. Alkyd resin of short-oil type or medium oil type, phenol resin, butylated benzoguanamine resin, epoxy resin, and the like also may be used for the same purpose as above.

The content of the resin for preventing inclusion of bubbles, such as the urea resin, is preferable to be 0.01 to 10 parts by weight, particularly 0.5 to 5 parts by weight per 100 parts by weight of the base resin. The resin less than 0.01 parts by weight does not give an adequate effect of preventing inclusion of bubbles, while the resin more than 10 parts by weight deteriorates the conductivity.

In the second and third aspects, the anisotropically electroconductive film is preferable to be added with at least a reactive compound (monomer), having at least an acryloxy group, methacryloxy group or epoxy group, in its resin composition in order to improve or control the characteristics—mechanical strength, adhesive properties, optical properties, resistance to heat, resistance to humidity, resistance to weathering, rate of crosslinking, etc. of the film. The types and content of the reactive compound have been referred in the first aspect.

In the second and third aspects, at least an organic peroxide is added as a curing agent for thermosetting the resin composition. Although any organic peroxide which has a tendency to decompose at a temperatures not less than 70° C. to produce a radical may be used, organic peroxides of which the half-life is 10 hours at temperatures not less than 50° C. are preferably used. The organic peroxides to be used are selected in consideration of the film forming temperature, the preparing temperature, curing (laminating) temperature of the film, the heat resistance of objects which are to be bonded together by the film, and storage stability of the agents.

Examples of the organic peroxides which may be used are 2,5-dimethylhexane-2,5-dihydroperoxide, 2,5-dimethyl-2,5-di(t-butylperoxy) hexyne, 3-di-t-butylperoxide, t-butylcumylperoxide, 2,5-dimethyl-2,5-di(t-butylperoxy)hexane, dicumylperoxide, α-α'-bis(t-butylperoxyisopropyl)benzene, n-butyl-4,4'-bis-(t-butylperoxy)valerate, 1-1-bis(t-butylperoxy)cychlohexane, 1-1-bis(t-butylperoxy)-3,3,5-trimethylcyclohexane, t-butylperoxybenzoate, benzoylperoxide, t-butylperoxyacetate, methylethylketoneperoxide, 2,5-dimethylhexyl-2,5-bisperoxybenzoate, butylhydroperoxide, p-menthanehydroperoxide, p-chlorobezoylperoxide, hydroxyheptylperoxide, chlorohexanoneperoxide, octanoylperoxide, decanoylperoxide, lauroylperoxide, cumylperoxyoctoate, succinic acid peroxide, acetylperoxide, t-butylperoxy(2-ethylhexanoate), m-toluoylperoxide, t-butylperoxyisobutylate, 2,4-dichlorobenzoylperoxide. Either one alone or more than two together of these organic peroxides may be used.

The content of the organic peroxides is preferable to be 0.1 to 10 parts by weight per 100 parts by weight of the base resin.

In the second and third aspects, at least a photosensitizer which produces a radical in response to light is added for the purpose of photo-setting of the resin composition. As the photosensitizer (initiator of photopolymerization), initiators of radical-photopolymerization are preferably used. Among the initiators of radical-photopolymerizations, benzophenone, methyl o-benzoylbenzoate, 4-benzoyl-4'-methyldiphenylsulfide, isopropylthioxanthone, diethylthioxanthone, ethyl 4-(diethylamino)benzoate, etc. may be used as a hydrogen-pulling type initiator, benzoin ether, benzoylpropyl ether, benzyldimethyl ketal, etc. may be used as an intramolecular-cleaving type initiator, 2-hydroxy-2-methyl-1-phenylpropane-1-one, 1-hydroxycyclohexylphenylketone, alkylphenylglyoxylate, diethoxyacetophenone may be used as an α-hydroxyalkylphenone-type initiator, and 2-methyl-1-[4-(methylthio)phenyl]-2-morpholinopropane-1,2-benzyl-2-dimethylamino-1-(4-morpholinophenyl)butanone-1. Acyl phosphine oxide and the like also may be used. Either one or more than two of these photosensitizers may be used.

The content of the photosensitizers is preferable to be 0.1 to 10 parts by weight per 100 parts by weight of the base resin.

The resin compositions of the second and third aspects are preferable to be added with at least a silane coupling agent in the same manner as the aforementioned first aspect in order to prompt the adhesion of the anisotropically electroconductive film.

The resin compositions of the second and third aspects can be added with at least a hydrocarbon resin in order to improve processing and laminating characteristics as described above.

The preferred electroconductive particles and the content of those have been referred in the first aspect.

The anisotropically electroconductive films of the second and third aspects are composed of the adhesive within which such electroconductive particles are distributed. The adhesive have been referred in the first aspect.

The anisotropically electroconductive films of the second and third aspects may be laminated on the objects to which the films are to be adhered by conventional methods; such as, a laminating method using a hot press, a direct laminating method using an extruding machine or calendering machine, a hot press laminating method using a film laminator and the like.

The components of the film may be dissolved homogeneously into a solvent which has no effect to a member (such as a separator) and, then, be applied uniformly to the surface of the member. In this case, another object (such as polyimide, copper foil, etc.) to be bonded to the member is temporarily contacted to the member, and then the object and the member are bonded together by thermosetting the film components.

The anisotropically electroconductive films of the second and third aspects are cured normally by heating it at 70 to 170° C. for 10 seconds to 120 minutes, preferably at 70 to 150° C. for 20 seconds to 60 minutes, depending on the type of the organic peroxide to be used.

In case of photo-setting by using the photosensitizer, many of illuminants which generate lights ranging from ultraviolet region to visible region; such as, ultra-high-pressure, high-pressure and low-pressure mercury vapor lamps, a chemical lamp, a xenon lamp, a halogen lamp, a mercury-halogen lamp, a carbon-arc lamp, an incandescent lamp and a laser, can be used. Time for irradiation is on the order of tens of seconds to tens of minutes, depending on the type of a lamp to be used and its strength of illumination.

The laminated film may be heated at 40 to 120° C. before irradiation of ultraviolet light in order to prompt hardening of the film.

The anisotropically electroconductive film is applied with pressure through its full thickness during the adhesion and electroconductivity arises in the film in such a direction that the pressure is applied to the film in the direction through the thickness of the film. In the third aspect, the pressure applied to the film normally is preferable to be at 3 MPa or less, particularly 2 to 3 MPa.

The anisotropically electroconductive films of the second and third aspects are preferable to have a conductivity of 10Ω or less, particularly 5Ω or less through its full thickness, and resistively of $10^6 \Omega$ or more, particularly $10^9 \Omega$ or more in the direction along its surface.

The anisotropically electroconductive films of the second and third aspects can be used for the same applications as conventional ones, including applications of making connections between various terminals, such as connections between FPC or TAB and ITO terminals on the glass board of a liquid crystal panel. A crossrinked structure is formed within the anisotropically electroconductive film during the hardening of the film. The anisotropically electroconductive films of the second and third aspects have a good adhesion, a good adherence particularly to the metal and also display a good durability and a high resistance to heat.

The anisotropically electroconductive film of the second aspect has good adhesion to both ITO and $SiO_x$, so that the film is available for making connection between these terminals.

Hereinafter, the second aspect will be described referring to examples and a comparative example.

EXAMPLES 4–13, COMPARATIVE EXAMPLE 2

25 weight percent toluene solution of polyvinyl butyral ("Denka PVB 3000-1" produced by Denki Kagaku Kogyo Co, Ltd.,) was prepared and the additives shown in Table 2 were added in the solution at amounts shown in Table 2. The solution thus prepared was applied on a separator made of an polyethyleneterephtalate by a bar coater so as to make a film having a width of 5 mm and a thickness of 15 μm.

The film was used for sticking a circuit-board made from PET resin on which an ITO terminal was formed over a $SiO_X$ layer to a circuit board made from polyimide on which copper foil was patterned. The film which had been separated from the separator was disposed therebetween by a monitor. After that, when the film was to be thermoset (in Examples 4–8), the film was heated at a temperature of 130° C. and a pressurized 3 MPa for 20 seconds. When the film was to be set by light (in Examples 9–13), on the other hand, the film was irradiated with a halogen lamp for 30 seconds instead of being heated. In order to study the adhesive properties of the resulted film, the adhesive strength of the film was measured by a tensile strength tester in 90° peel strength test (50 mm/min) and the resistance was measured by a digital multimeter through the full thickness of the film. The results of the measurement are shown in Table 2.

The base resin of the resin composition of which the adhesive of the third aspect is to be composed has been referred in the second aspect.

In the third aspect, at least a polymerization inhibitor is used in order to adjust the time for the film to start hardening. The type of the polymerization inhibitor is not limited as much as the polymerization inhibitor can inhibit crosslinking reaction caused by organic peroxides or photosensitizers. Examples of the polymerization inhibitor are p-benzoquinone, naphtoquinone, phenanthraquinone, p-xyloquinone, p-toluquinone, 2,6-dichloroquinone, 2,5-diphenyl-p-benzoquinone, 2,5-diacetoxy-p-benzoquinone, hydroquinone, p-t-butylcatechol, 2,5-di-t-butylhydroquinone, mono-t-butylhydroquinone, 2,5-di-t-amylhydroquinone, di-t-butyl-p-cresol, hydroquinrone monomethyl eter, α-naphtol, acetamidineacetate, acetamidinesulfate, phenylhydrazinehydrochloride, hydrazinehydrochloride, trimethylbenzylammoniumchloride, laurylpyridiniumchloride, cetyltrimethylammoniumchloride,

TABLE 2

|  | Example ||||||||||| Comparative Example |
| --- | --- | --- | --- | --- | --- | --- | --- | --- | --- | --- | --- |
|  | 4 | 5 | 6 | 7 | 8 | 9 | 10 | 11 | 12 | 13 | 2 |
| resin composition [parts by weight] | | | | | | | | | | | |
| base resin | 100 | 100 | 100 | 100 | 100 | 100 | 100 | 100 | 100 | 100 | 100 |
| organic peroxide *1 | 2 | 2 | 2 | 2 | 2 | — | — | — | — | — | 2 |
| photosensitizer *2 | — | — | — | — | — | 2 | 2 | 2 | 2 | 2 | — |
| melamine resin *3 | 3 | 3 | 3 | 3 | 3 | 3 | 3 | 3 | 3 | 3 | — |
| urea resin *4 | — | — | — | — | 2 | — | — | — | — | 2 | — |
| acryloxy group 1 *5 | — | — | — | 10 | — | — | — | — | 10 | — | — |
| acryloxy group-bearing composition 1 *6 | 15 | — | — | — | 15 | 15 | — | — | — | 15 | 15 |
| methacryloxy group-bearing composition 2 *7 | — | 10 | — | — | — | — | 10 | — | — | — | — |
| epoxy group-bearing composition *8 | — | — | 10 | 5 | — | — | — | 10 | 5 | — | — |
| silane coupling agent *9 | 0.5 | 0.5 | 0.5 | 0.5 | 0.5 | 0.5 | 0.5 | 0.5 | 0.5 | 0.5 | 0.5 |
| hydrocarbon resin *10 | — | — | — | 3 | — | — | — | — | 3 | — | — |
| conductive particles *11 | 4 | 4 | 4 | 4 | 4 | 4 | 4 | 4 | 4 | 4 | 4 |
| anisotropic conductive film | | | | | | | | | | | |
| adhesive strength (kg/cm) | 1 | 0.9 | 0.8 | 0.8 | 1 | 0.6 | 0.5 | 0.5 | 0.5 | 0.6 | 0.1 |
| conductive resistance (Ω) | 3 | 3 | 3 | 3 | 3 | 3 | 3 | 3 | 3 | 3 | 3 |

*1: benzoyl peroxide
*2: benzoyl propyleter
*3: "Super Bekkamin L125-60", a butylated melamine resin produced by Dai Nippon Kagaku Kogyo Inc.
*4: "Bekkamin P138", a butylated urea resin produced by Dai Nippon Kagaku Kogyo Inc.
*5: polyethyleneglycol diacrylate
*6: pentaerythritol tetraacrylate
*7: neopentyl glycol dimethacrylate
*8: glycidylmethacrylate
*9: γ-methacryloxypropyl trimethoxysilane
*10: "Arukon P70", a hydrocarbon resin produced by Arakawa Kagaku Inc.
*11: Nickel particles produced by Fukuda Kinzoku Haku Fun Kogyo Inc., which have an average diameter of 10 μm and are expressed by percentage by volume for base resin It is apparent from table 2 that the anisotropically electroconductive film of the second aspect has remarkably excellent adhesive properties.

As described above, according to the second aspect, there can be provided an anisotropically electroconductive film which has good adhesion to both ITO and $SiO_X$.

III. The Anisotropically Electroconductive Film of the Third Aspect

Hereinafter, preferred embodiments of the third aspect will be described in detail.

phenyltrimethylammoniumchloride, trimethylbenzylammoniumoxalate, trimethylbenzylammoniummaleate, phenyl-β-naphtylamine, p-benzylaminophenol, dinitrobenzene, trinitrotoluene, picric acid, quinonedioxime, cyclohexanone oxime, pyrogallol, tannic acid, resorcin, triethylaminehydrochloride, dimethylanilinehydrochloride, dibutylaminehydrochloride.

One or more than two among these polymerization inhibitors are added into the resin composition normally at a rate of 100 to 50000 ppm. The polymerization inhibitor of less than 100 ppm makes it hard to control the time for the film to start hardening, while the polymerization inhibitor of more than 50000 ppm excessively inhibits the crosslinking reaction so that the film cannot achieve an adequate adhesion. The preferred content of the polymerization inhibitor is 200 to 10000 ppm.

In the third aspect, the anisotropically electroconductive film is preferable to be added with at least a reactive compound (such as monomer), having at least an acryloxy group, methacryloxy group or epoxy group, in its resin composition in order to improve or control the characteristics—mechanical strength, adhesive properties, optical properties, resistance to heat, resistance to humidity, resistance to weathering, rate of crosslinking, etc.—of the film as referred in the second aspect.

In the third aspect, at least a organic peroxide is added as a curing agent for thermosetting the resin composition as referred in the second aspect.

In the third aspect, at least a photosensitizer which produces a radical in response to light is added for the purpose of photo-setting (photo curing) the resin composition as referred in the second aspect.

As described above, the resin composition of the third aspect is preferable to be added with at least a silane coupling agent as an adhesion accelerator.

The resin composition of the third aspect can be added with at least a hydrocarbon resin in order to improve processing and laminating characteristics as referred above.

Co. Ltd.,) was prepared and the additives shown in Table 3 were added in the solution at amounts shown in Table 3. The solution thus prepared was applied on an ethylene polyterephtalate to be used as separator by a bar coater so as to make a film having a width of 5 mm and thickness of 15 μm.

The film was used for sticking FPC to a transparent electrode-board. The film which had been separated from the separator was registered through a monitor. After that, in such a case that the film was to be thermoset (in Examples 14–16), it was heated at 130 ° C. and also pressurized at 3 MPa for 20 seconds. In such a case that the film was to be set by light (in Examples 17, 18), on the other hand, it was irradiated with a halogen lamp for 30 seconds in stead of being heated. In order to study the adhesive properties of the resulted film, the adhesive strength of the film was measured by a tensile strength tester in 90° peel strength test (50 mm/min) and the resistance to conduction through the full thickness of the film and the insulation resistance in the direction along the surface of the film were measured by a digital multimeter. The results of the measurement are shown in Table 3.

TABLE 3

| | Example | | | | | Comparative Example |
|---|---|---|---|---|---|---|
| | 14 | 15 | 16 | 17 | 18 | 3 |
| resin composition [parts by weight] | | | | | | |
| base resin | 100 | 100 | 100 | 100 | 100 | 100 |
| organic peroxide *1 | 4 | 4 | 4 | — | — | 4 |
| photosensitizer *2 | — | — | — | 4 | 4 | 4 |
| acryloxy group-bearing composition 1 *3 | 20 | — | 20 | 20 | 20 | 20 |
| methacryloxy group-bearing composition *4 | — | 20 | — | — | — | — |
| silane coupling agent *5 | 1 | 1 | 1 | 1 | 1 | 1 |
| hydroxy carbon *6 | — | — | 3 | — | 3 | — |
| polymerization inhibitor (ppm) *7 | 500 | 500 | 500 | 500 | 500 | — |
| conductive particles (vol. %) *8 | 10 | 10 | 10 | 10 | 10 | 10 |
| anisotropic conductive film | | | | | | |
| adhesive strength (kg/cm) | 2.6 | 2.8 | 2.7 | 1.8 | 2.2 | 1.2 |
| conductive resistance (Ω) | less than 0.6 | less than 0.6 | less than 0.6 | less than 0.6 | less than 0.6 | less than 0.6 |
| insulation resistance (Ω) | more than $10^{13}$ | more than $10^{13}$ | more than $10^{13}$ | more than $10^{13}$ | more than $10^{13}$ | more than $10^{13}$ |

*1: benzoyl peroxide
*2: benzoyl propylether
*3: pentaerythritol tetraacrylate
*4: neopentyl glycol dimethacrylate
*5: γ-methacryloxypropyl trimethoxysilane
*6: "Arukon P70", a hydrocarbon resin produced by Arakawa Kagaku Inc.
*7: hydroquinone monomethylether, the values of which are expressed by contents [ppm] in resin composition
*8: Nickel particles produced by Fukuda Kinzoku Haku Fun Kogyo Inc., which have an average diameter of 5 μm and are expressed by percentage by volume for base resin The preferred electroconductive particles and the content of those have been referred in the first and second aspects.

The anisotropically electroconductive film of the third aspect is suitable to stick at a temperature between 100 and 130° C. under a pressure between 2 and 3 MPa.

Hereinafter, the third aspect will be described referring to examples and a comparative example.

EXAMPLE 14–18, COMPARATIVE EXAMPLE 3

25 weight percent toluene solution of polyvinyl butyral ("Denka PVB 3000-1" produced by Denki Kagaku Kogyo It is apparent from Table 3 that the anisotropically electroconductive film of the third aspect displays very good adhesive properties and reliability in its capacity for conducting electricity.

EXAMPLE 19, COMPARATIVE EXAMPLES 4, 5

A film was prepared for bonding circuit-boards together in the same manner as Example 1 except that the content of the polymerization inhibitor in the resin composition was taken as the amount shown in Table 4. The adhesive strength of the film was measured in the same manner as Example 1 and the result is shown in Table 4, provided that the adhesive strength of the films of Comparative Example 3 and Example 14 also are shown in Table 4.

TABLE 4

|  | polymerization inhibitor (ppm) | adhesive strength (kg/inch) |
| --- | --- | --- |
| Comparative Example 3 | 0 | 1.2 |
| Example 14 | 500 | 2.6 |
| Example 19 | 1000 | 2.4 |
| Comparative Example 4 | 50000 | 0.3 |
| Comparative Example 5 | 100000 | 0.2 |

It is apparent from Table 4 that unduly large amounts of the polymerization inhibitor makes the reaction hard to proceed sufficiently under such an adhesive condition that the film is heated at 130° C. for 20 seconds, and it lessens the adhesive strength of the anisotropically electroconductive film.

As described above, according to the third aspect, there can be provided an anisotropically electroconductive film of which an adhesive is easily controlled in its reaction rate of hardening and which has a high reliability in conductivity and also a good adhesion under such an adhesive condition that the film is heated at a low temperature under a low pressure.

What is claimed is:

1. An anisotropically electroconductive film comprising: an adhesive containing a thermosetting resin composition including a polyacetalized base resin made of polyvinyl alcohol, a reactive compound made of at least one material selected from the group consisting of acryloxy group-bearing compounds, methacryloxy group-bearing compounds and epoxy group-bearing compounds, an organic peroxide, and a reaction accelerating compound having a radically reactive group and an alkali-reactive group as its end groups, and electroconductive particles dispersed in the adhesive.

2. An anisotropically electroconductive film as claimed in claim 1, wherein said thermosetting resin composition includes 0.5 to 50 parts by weight of the reaction accelerating compound per 100 parts by weight of the base resin.

3. An anisotropically electroconductive film as claimed in claim 1, wherein said reaction accelerating compound has at least an acryloxy group or methacryloxy group as said radically reactive group and has at least a carboxyl group or acidic hydroxyl group as said alkali-reactive group.

4. An anisotropically electroconductive film as claimed in claim 3, wherein said reaction accelerating compound is at least one selected from the group consisting of acrylic acid, 2-acryloyloxyethylsuccinic acid, 2-acryloyloxyethylphthalic acid, 2-acryloyloxyethylhexahydrophthalic acid, methacrylic acid, 2-methacryloyloxyethylsuccinic acid and 2-methacryloyloxyethylhexahydrophthalic acid.

5. An anisotropically electroconductive film as claimed in claim 1, wherein said thermosetting resin composition includes 0.5 to 80 parts by weight of the reactive compound per 100 parts by weight of the base resin.

6. An anisotropically electroconductive film as claimed in claim 1, wherein said organic peroxide is a low-temperature-decomposable organic peroxide having a 10 hours half-life temperature of not higher than 80° C.

7. An anisotropically electroconductive film as claimed in claim 1, wherein said thermosetting resin composition includes 0.1 to 10 parts by weight of the organic peroxide per 100 parts by weight of the base resin.

8. An anisotropically electroconductive film as claimed in claim 1, wherein said polyacetalized resin has equal to or more than 30 mole percent of acetal groups.

9. An anisotropically electroconductive film as claimed in claim 1, wherein said thermosetting resin composition further includes a silane coupling agent in an amount of 0.01 to 5 parts by weight per 100 parts by weight of the base resin.

* * * * *